US009595754B2

(12) United States Patent
Radi et al.

(10) Patent No.: US 9,595,754 B2
(45) Date of Patent: Mar. 14, 2017

(54) PATTERNED CONDUCTIVE STRUCTURE AND METHOD FOR FORMING THE SAME

(71) Applicant: Wistron NeWeb Corp., Hsinchu (TW)

(72) Inventors: Babak Radi, Hsinchu (TW); Yong-Jyun Lu, Hsinchu (TW); Ming-Chi Chiu, Hsinchu (TW); Chien-Min Hsu, Hsinchu (TW); Shih-Hong Chen, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 112 days.

(21) Appl. No.: 14/583,446

(22) Filed: Dec. 26, 2014

(65) Prior Publication Data

US 2016/0192482 A1 Jun. 30, 2016

(51) Int. Cl.

| | |
|---|---|
| ***H01Q 1/38*** | (2006.01) |
| ***H05K 3/04*** | (2006.01) |
| ***H05K 3/14*** | (2006.01) |
| ***H05K 3/16*** | (2006.01) |
| *H05K 1/03* | (2006.01) |
| *H05K 3/38* | (2006.01) |
| *H01Q 1/22* | (2006.01) |

(52) U.S. Cl.

CPC ............... *H01Q 1/38* (2013.01); *H05K 3/048* (2013.01); *H05K 3/146* (2013.01); *H05K 3/16* (2013.01); *H01Q 1/22* (2013.01); *H05K 1/0326* (2013.01); *H05K 1/0346* (2013.01); *H05K 1/0353* (2013.01); *H05K 3/381* (2013.01); *H05K 2201/0129* (2013.01); *H05K 2203/0769* (2013.01); *H05K 2203/0783* (2013.01); *H05K 2203/107* (2013.01); *H05K 2203/1184* (2013.01); *H05K 2203/308* (2013.01)

(58) Field of Classification Search

CPC . H01Q 1/38; H01P 11/00; H05K 1/09; H05K 1/187; H05K 3/184; H05K 3/187

See application file for complete search history.

(56) References Cited

U.S. PATENT DOCUMENTS

| | | | | |
|---|---|---|---|---|
| 4,865,873 A * | 9/1989 | Cole, Jr. | H05K 3/184 | 427/271 |
| 7,252,891 B2 * | 8/2007 | Higashitani | H05K 1/187 | 428/209 |
| 2014/0014401 A1 * | 1/2014 | Liao | H05K 3/184 | 174/257 |

* cited by examiner

*Primary Examiner* — Hoang V Nguyen

(74) *Attorney, Agent, or Firm* — Muncy, Geissler, Olds & Lowe, P.C.

(57) ABSTRACT

A method for forming a patterned conductive structure is provided. The method includes forming a soluble layer on a surface of a substrate, wherein the soluble layer has an opening exposing a rough portion of the surface. A first conductive layer is formed on the soluble layer, wherein the first conductive layer extends onto the rough portion in the opening. The soluble layer and the first conductive layer on the soluble layer are removed, wherein a portion of the first conductive layer corresponding to the rough portion is remained on the substrate. A patterned conductive structure formed by the method is also provided.

14 Claims, 5 Drawing Sheets

PATTERNED CONDUCTIVE STRUCTURE AND METHOD FOR FORMING THE SAME

BACKGROUND OF THE INVENTION

Field of the Invention

The present invention relates to a patterned conductive structure, and in particular to an antenna element comprising a patterned conductive structure and a method for forming the same.

Description of the Related Art

With the progress of mobile communication technology, portable electronic devices, such as portable computers, mobile phones, tablet computers, multimedia players and other hybrid functional mobile devices, have become more common. To satisfy user demand, portable electronic devices usually comprise an antenna element to perform wireless communication functions.

Formation of antenna elements concerns laser direct structuring (LDS) technology. For example, manufacturing processes for antenna elements generally comprise providing a substrate containing a catalyst for an electroless process and forming a plating resist material on the entire surface of the substrate. A portion of the plating resist material within a predetermined region on the substrate is then removed and the catalyst in the predetermined region is activated through laser ablation. Next, a metal layer is formed on the substrate in the predetermined region by an electroless process using the activated catalyst, such that a conductive pattern is formed. Afterward, the surface of the substrate is cleaned by an etching process and the formation of an antenna element with a conductive pattern is completed.

However, the surface of the substrate can be damaged during the aforementioned etching process. Moreover, the substrate needs to be a special material with catalysts or other active additives to make the conductive pattern active.

Thus, there exists a need in the art for development of a patterned conductive structure and methods for forming the same capable of mitigating or eliminating the aforementioned problems. Furthermore, reducing costs in producing the antenna elements comprising a patterned conductive structure and increasing the mechanical properties of the substrates have become important issues.

BRIEF SUMMARY OF INVENTION

A detailed description is given in the following embodiments with reference to the accompanying drawings. A semiconductor device and method for forming the same are provided.

An exemplary embodiment of a method for forming a patterned conductive structure according to the invention is provided. The method comprises forming a soluble layer on a surface of a substrate, wherein the soluble layer has an opening exposing a rough portion of the surface. A first conductive layer is formed on the soluble layer, wherein the first conductive layer extends onto the rough portion in the opening. The soluble layer and the first conductive layer on the soluble layer are removed, wherein a portion of the first conductive layer corresponding to the rough portion is remained on the substrate.

An exemplary embodiment of a patterned conductive structure according to the invention is provided. The patterned conductive structure comprises a substrate, wherein a surface of the substrate has a rough portion and a smooth portion. A first conductive layer is disposed on the substrate and corresponding to the rough portion, wherein the first conductive layer is a physical vapor deposition layer and the smooth portion is exposed. A second conductive layer is directly disposed on the first conductive layer and corresponds to the rough portion.

The main technical feature of the development of a patterned conductive structure and methods for forming the same is to utilize laser ablation to remove a soluble coating layer on a general substrate. A conductive layer is then directly formed on the substrate through physical vapor deposition (PVD) treatment. Since the soluble coating layer can be removed easily from the substrate by a solvent, a conductive layer having a predetermined conductive pattern is remained after a washing treatment. In other words, the predetermined conductive pattern is generated by the washing treatment.

According to the embodiments, there is no need to use special substrates that contain active catalysts for an electroless plating process. A general substrate with better mechanical properties and a lower price can be used. In other words, there are more options for selecting the substrates. Substrates of different colors can be selected as long as the color has enough laser absorption.

Moreover, the soluble layer can be removed easily by a nonaggressive solvent, such as water, alcohol or the like, without using an extra cleaning process or treatment such as laser ablation or a high-energy beam. Since the solvent is not an aggressive chemical that would damage the thin PVD layer and the surface of the substrate, the patterned conductive structure can have a better quality.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
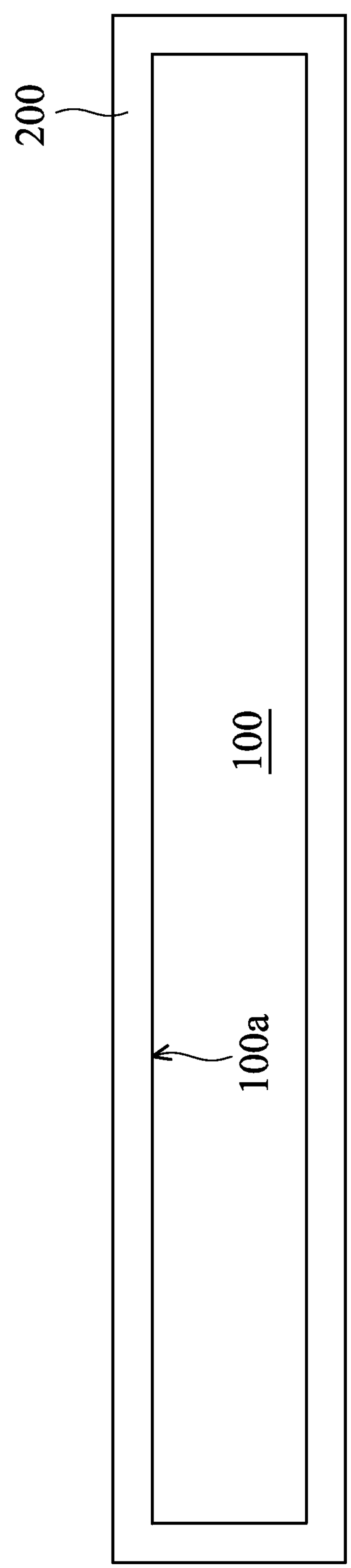
FIGS. 1A to 1E are cross-sectional views of an exemplary embodiment of a method for forming a patterned conductive structure according to the invention.

The following description is of a mode for carrying out the invention. This description is made for the purpose of illustrating the general principles of the invention and should not be taken in a limiting sense. The scope of the invention is best determined by reference to the appended claims. Moreover, the same or similar elements in the drawings and the description are labeled with the same reference numbers.

An exemplary embodiment of a method for forming a patterned conductive structure according to the invention is illustrated with FIGS. 1A to 1E, wherein FIGS. 1A to 1E are cross-sectional views of an exemplary embodiment of a method for forming a patterned conductive structure according to the invention.

Referring to FIG. 1A, a substrate 100 having a surface 100*a* is provided. In one embodiment, the surface 100*a* is smooth. In the embodiment, the substrate 100 may comprise polycarbonate (PC), acrylonitrile butadiene styrene (ABS), PC and ABS alloy (PC/ABS), nylon (PA) or another suitable polymer substrate.

Next, a soluble layer 200 is formed on the surface 100*a* of the substrate 100 by a coating process (such as a spray coating or a spin coating) or another suitable deposition process and a subsequent drying process at about 30° C. for about 2 hours. In the embodiment, the soluble layer 200 covers all of the surfaces of the substrate 100. However, in other embodiments, the soluble layer 200 may cover some of the surfaces of the substrate 100 and expose the rest of the surfaces. It depends on design demands. In the embodiment, the soluble layer 200 may comprise polyvinyl alcohol, polyethylene glycol, polyethylene glycol-polypropylene glycol copolymer, linear polyacrylamice, polyvinylpyrrolidone (homo or copolymer), polyacrylic acid, a combination thereof or another suitable soluble material. For example, the substrate 100 can be immersed in a coating solution, which may be polyvinylpyrrolidone (PVP) in ethanol and have a concentration of about 10% to 15% to form the soluble layer 200 on the surface 100*a*. Moreover, the soluble layer 200 may have a thickness of less than 5 μm or any suitable thickness.

Figure 1B:
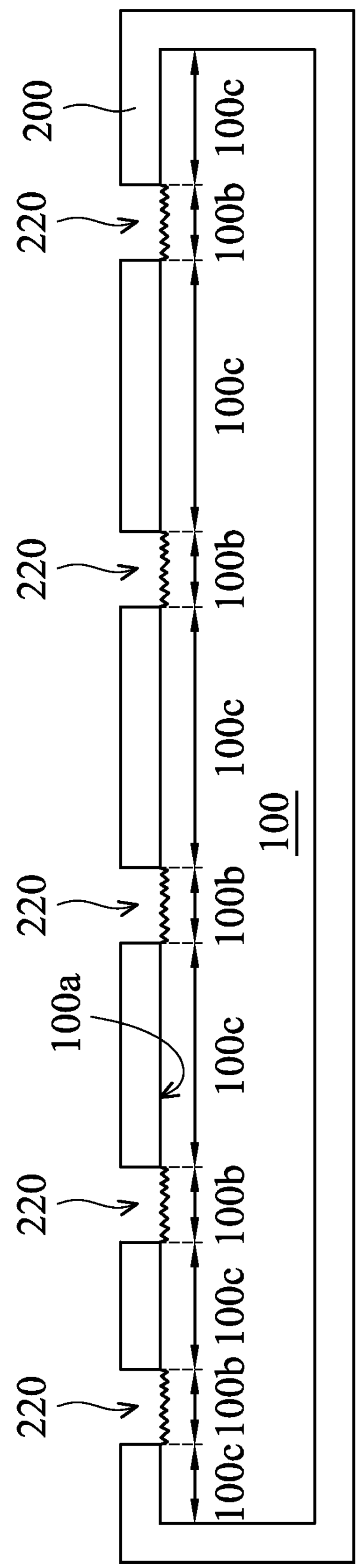

Referring to FIG. 1B, a laser treatment is performed on the soluble layer 200 to form a plurality of openings 220 in the soluble layer 200 in a predetermined pattern area. In other words, the soluble layer 200 is patterned by the laser treatment. As a result, some portions of the surface 100*a* corresponding to the openings 220 are roughened by laser ablation, such that rough portions 100*b* are formed in the predetermined pattern area. In one embodiment, since the surface 100*a* is smooth, the surface 100*a* of the substrate 100 is divided into rough portions 100*b* and smooth portions 100*c* through the laser ablation.

Moreover, forming the openings 220 of the soluble layer 200 by the laser treatment helps the substrate 100 in the predetermined pattern area become rougher if the substrate 100 could absorb enough laser energy at the laser wavelength. The surface roughness of the substrate 100 improves adhesion between the substrate 100 and a subsequently formed first conductive layer.

For example, the laser treatment may employ a red laser having a wavelength of 1064 nm with about 8 to 10 W and 50% to 80% overlapping, a green laser having a wavelength of 532 nm with about 5 to 7 W and 40% to 80% overlapping or a UV laser having a wavelength of 355 nm with about 3 to 4 W and 40% to 70% overlapping.

It should be realized that the number, contour and position of the openings 220 of the soluble layer 200 or the rough portions 100*b*, which correspond to the predetermined pattern, shown in figures are illustrated as an example and they are not limited thereto. The actual number, contour and position of the openings 220 of the soluble layer 200 or the rough portions 100*b* are determined by design demands.

Figure 1C:
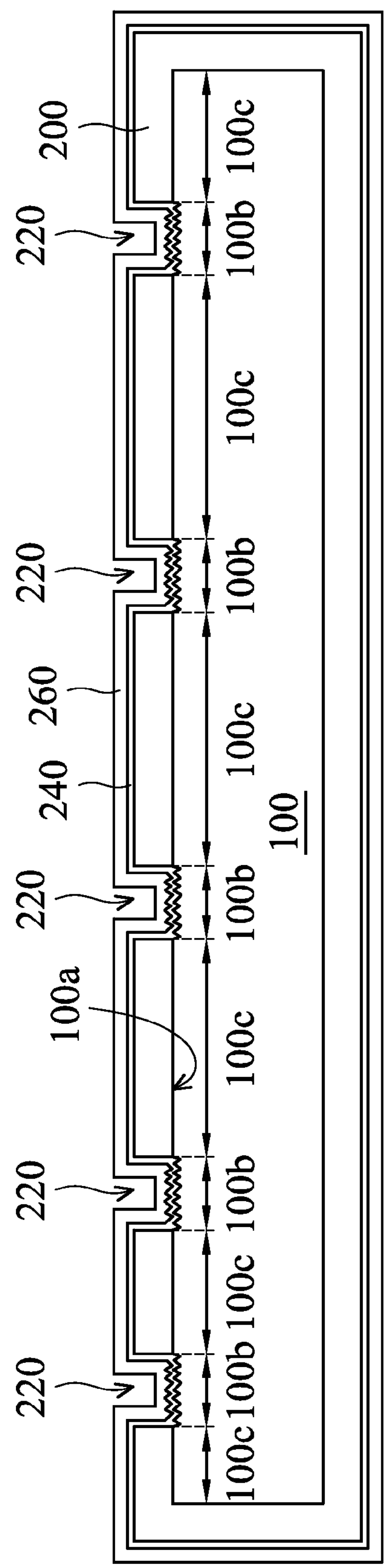

Referring to FIG. 1C, a plasma cleaning process and a deposition process, such as physical vapor deposition (PVD) process, a sputtering process, an ion plating process or a vacuum evaporation process, or another suitable deposition process, are performed to form a first conductive layer on the soluble layer 200. The first conductive layer extends to sidewalls of the openings 220 and onto the rough portions 100*b* in the openings 220. In other words, the first conductive layer is deposited conformably on the substrate 100.

In the embodiment, the first conductive layer comprises an underlying layer 240 and an overlying layer 260. For example, the underlying layer 240 comprises Ni, Pd, Ag or another suitable metal material and the overlying layer 260 comprises Cu or another suitable metal material. The underlying layer 240 can increase adhesion between the overlying layer 260 and the substrate 100. In other embodiments, the first conductive layer may comprise one or more than two layers.

In the embodiment, the underlying layer 240 may have a thickness in a range of about 0.02 μm to about 0.06 μm, such as 0.03 μm to 0.05 μm. Moreover, the overlying layer 260 may have a thickness in a range of about 0.05 μm to about 0.3 μm, such as 0.1 μm to 0.25 μm. In the embodiment, the underlying layer 240 is continuously and conformably formed on the smooth portions 100*c* and the rough portions 100*b* of the surfaces 100*a* of the substrate 100. However, in other embodiments, the underlying layer 240 may be discontinuous. For example, the underlying layer 240 may be particles.

Figure 1D:
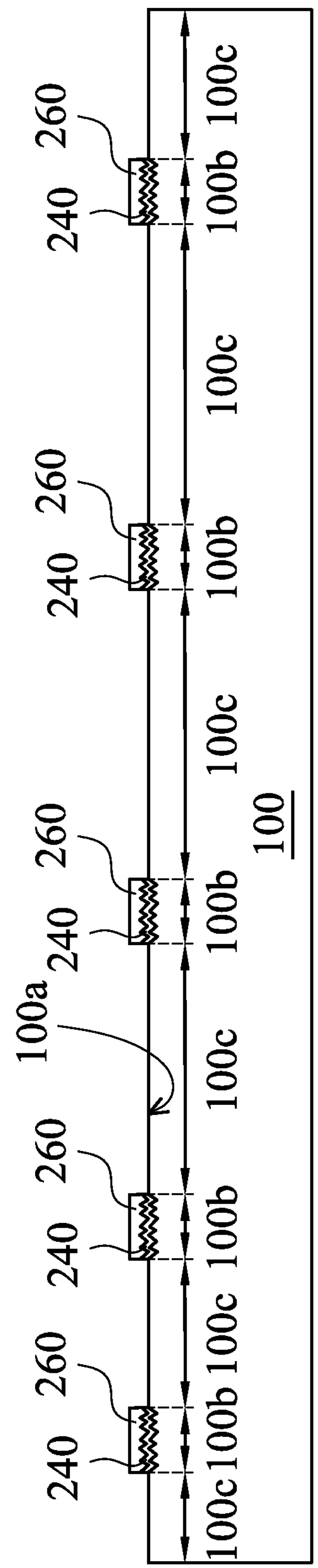

Referring to FIG. 1D, the soluble layer 200 is removed by a washing process using a solvent which is selected from a group consisting of water, ethanol, methanol, isopropanol, dimethylformamide (DMF), chloroform, another suitable solvent or combinations thereof. In the embodiment, the solvent is a neutral solution, rather than an acidic or basic solution. Moreover, the underlying layer 240 and the overlying layer 260 on the soluble layer 200 are also removed during the washing process while the underlying layer 240 and the overlying layer 260 corresponding to the rough portions 100*b* are remained on the substrate 100. As a result, the surface 100*a* outside of the rough portions 100*b*, such as the smooth portions 100*c*, is fully exposed. In other words, the underlying layer 240 and the overlying layer 260 are patterned to the predetermined pattern through the laser ablation and washing process.

Figure 1E:
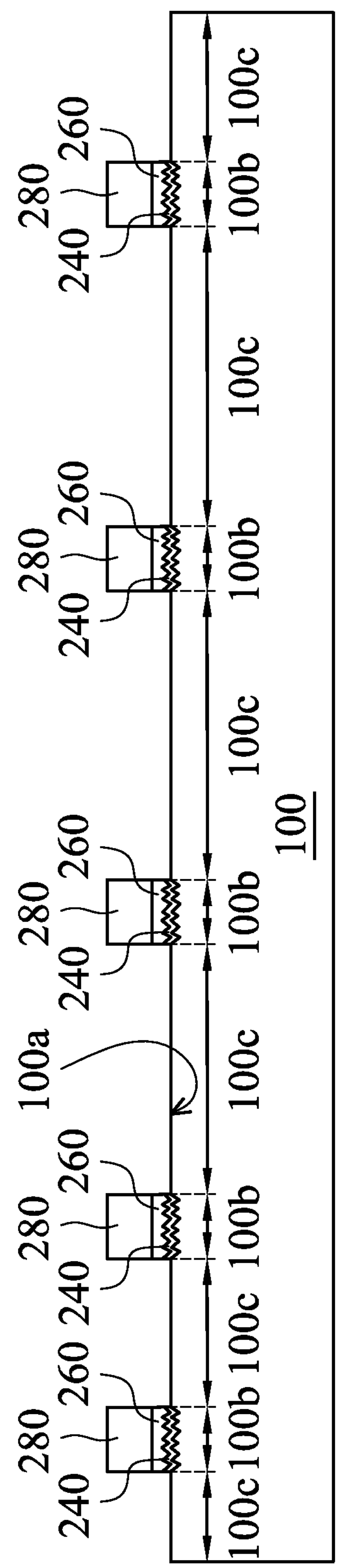

Referring to FIG. 1E, a second conductive layer 280 is directly deposited on the overlying layer 260 corresponding to the rough portions 100*b* by an electroless process or another suitable deposition process so as to increase the thickness of the conductive pattern. In one embodiment, the second conductive layer 280 is made of the same material as the first conductive layer. The thickness of the second conductive layer 280 depends on the desired thickness of the conductive pattern. In one embodiment, an optional conductive layer (not shown), such as a Ni layer, may be formed on the second conductive layer 280 to provide protection. Thus, the first and second conductive layers corresponding to the rough portions form the conductive pattern on the substrate and therefore, fabrication of the patterned conductive structure is completed.

In one embodiment, an additional etching process, such as a wet etching process, or another suitable etching process, may be performed to remove the residues, which may comprise the underlying layer 240, the overlying layer 260 or combinations thereof, on the smooth portions 100*c* of the surface 100*a*. Since the conductive pattern corresponding to the rough portions 100*b* gets thicker by forming the second conductive layer 280 while the residues corresponding to the smooth portions 100*c* of the surface 100*a* are much thinner, the residues can be dissolved faster and more easily. Therefore, performing the additional etching process after depositing the second conductive layer 280 is advantageous.

According to the embodiments, the patterned conductive structure that is formed may be an antenna element. In one embodiment, the substrate 100 may be a housing of an electronic device. Namely, the patterned conductive structure of the antenna element is directly formed on the housing of the electronic device. In other embodiments, the patterned conductive structure of the antenna element may be additionally fixed on the housing of the electronic device. It should be realized that the aforementioned method for forming a patterned conductive structure can be implemented to fabricate not only an antenna element but also any patterned conductive structure, such as a wiring layer or an electrode pattern.

In the embodiment, as shown in FIG. 1E, a patterned conductive structure according to the invention comprises a substrate 100, wherein a surface 100*a* of the substrate 100 has a rough portion 100*b*. A first conductive layer is disposed on the substrate 100 and corresponds to the rough portion 100*b*. Namely, the rough portion 100*b* is covered by the first conductive layer while another portion of the surface 100*a* is smooth and exposed, such as a smooth portion 100*c* of the surface 100*a* is exposed. The first conductive layer is a physical vapor deposition layer and comprises an underlying layer 240 and an overlying layer 260. In the embodiment, the patterned conductive structure is an antenna element.

In general, the manufacturing processes for antenna elements comprise providing a non-conductive substrate containing a catalyst for an electroless process and forming a plating resist material on the entire surface of the non-conductive substrate. A portion of the plating resist material is then removed through laser ablation. During the laser ablation, the catalyst is activated. Next, a patterned metal layer is formed on the non-conductive substrate by an electroless process using the activated catalyst.

Compared to the aforementioned manufacturing processes, according to the embodiments, the substrate 100 can be general materials, such as polycarbonate (PC), acrylonitrile butadiene styrene (ABS), PC and ABS alloy (PC/ABS), nylon or another suitable polymer material, and there is no need to use material with catalysts or other active additives to make the conductive pattern active. Thus, mechanical properties of the substrate 100 can be enhanced further and the manufacturing cost is also reduced.

In addition, only a normal drying method is performed after coating the soluble layer 200 on the substrate 100 and there is no need for curing, such as with heat or UV light. As a result, the soluble layer can be removed easily by the subsequent solvent washing process and that can solve the dimensional stability problem due to heat treatment (i.e., in the heat or UV curing process).

In summary, according to the embodiments, there is no need to use special substrates that contains active catalysts for an electroless plating process. A general substrate with better mechanical properties and a lower price can be selected. In other words, there are more options for selecting the substrates. Substrates of different colors can be selected as long as the color has enough laser absorption. Moreover, the soluble layer can be removed easily by a nonaggressive solvent, such as water, alcohol or the like, without using an extra cleaning process or treatment such as laser ablation or a high-energy beam. As a result, since the solvent is not an aggressive chemical (such as an acidic or basic solution) which would damage the thin PVD layer and the surface of the substrate, the patterned conductive structure has a better quality.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a patterned conductive structure, comprising:

forming a soluble layer on a surface of a substrate, wherein the soluble layer has an opening exposing a rough portion of the surface of the substrate;

forming a first conductive layer on the soluble layer, wherein the first conductive layer extends onto the rough portion in the opening; and removing the soluble layer and the first conductive layer on the soluble layer, wherein a portion of the first conductive layer corresponding to the rough portion is remained on the substrate.

2. The method as claimed in claim 1, wherein the step of removing the soluble layer and the first conductive layer on the soluble layer comprises performing a washing process using a solvent.

3. The method as claimed in claim 2, wherein the solvent is selected from a group consisting of water, ethanol, methanol, isopropanol, dimethylformamide (DMF), chloroform or a combination thereof.

4. The method as claimed in claim 1, wherein the soluble layer is dissolved in a nonaggressive solvent to be removed.

5. The method as claimed in claim 1, wherein the soluble layer comprises polyvinyl alcohol, polyethylene glycol, polyethylene glycol-polypropylene glycol copolymer, linear polyacrylamice, polyvinylpyrrolidone (homo or copolymer), polyacrylic acid or a combination thereof.

6. The method as claimed in claim 1, wherein the substrate comprises polycarbonate (PC), acrylonitrile butadiene styrene (ABS), PC and ABS alloy or nylon (PA).

7. The method as claimed in claim 1, wherein the step of forming the soluble layer comprises:

coating the soluble layer on the substrate; and forming the opening of the soluble layer and the rough portion of the surface by a laser treatment.

8. The method as claimed in claim 1, wherein the step of forming the first conductive layer on the soluble layer comprises a physical vapor deposition (PVD) process, a sputtering process, an ion plating process or a vacuum evaporation process.

9. The method as claimed in claim 1, wherein a smooth portion of the surface of the substrate is exposed after removing the soluble layer.

10. The method as claimed in claim 1, wherein the first conductive layer comprises an underlying layer and an overlying layer, and wherein the underlying layer comprises Ni, Pd or Ag and the overlying layer comprises Cu.

11. The method as claimed in claim 1, further comprising forming a second conductive layer directly on the first conductive layer corresponding to the rough portion.

12. The method as claimed in claim 11, wherein the second conductive layer is formed by an electroless process.

13. The method as claimed in claim 11, further comprising removing residues on the surface outside of the rough portion by an etching process after forming the second conductive layer.

14. The method as claimed in claim 1, wherein the patterned conductive structure forms an antenna element.

* * * * *